United States Patent
Akiyama et al.

(10) Patent No.: US 8,975,681 B2
(45) Date of Patent: Mar. 10, 2015

(54) SEMICONDUCTOR DEVICE

(71) Applicant: Mitsubishi Electric Corporation, Tokyo (JP)

(72) Inventors: Hajime Akiyama, Tokyo (JP); Akira Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 99 days.

(21) Appl. No.: 13/907,589

(22) Filed: May 31, 2013

(65) Prior Publication Data

US 2014/0077284 A1    Mar. 20, 2014

(30) Foreign Application Priority Data

Sep. 19, 2012 (JP) ................. 2012-205543

(51) Int. Cl.
*H01L 27/108* (2006.01)
*H01L 29/76* (2006.01)
*H01L 27/06* (2006.01)

(52) U.S. Cl.
CPC ................. *H01L 27/0629* (2013.01)
USPC ........... 257/302; 257/409; 257/484; 257/508

(58) Field of Classification Search
CPC ..................... H01L 27/10855; H01L 27/0629; H01L 29/0623; H01L 29/7395
USPC .................. 257/302, 409, 484, 508
See application file for complete search history.

(56) References Cited

U.S. PATENT DOCUMENTS 6,150,702 A * 11/2000 Funaki et al. ............... 257/409
8,476,732 B2 * 7/2013 Senoo ........................ 257/488

FOREIGN PATENT DOCUMENTS

JP    2008-13530 A    5/2008

* cited by examiner

*Primary Examiner* — Theresa T Doan
(74) *Attorney, Agent, or Firm* — Studebaker & Brackett PC

(57) ABSTRACT

In one surface of a semiconductor substrate, an active region in which main current flows and an IGBT is disposed is formed. A termination structure portion serving as an electric-field reduction region is formed laterally with respect to the active region. In the termination structure portion, a porous-oxide-film region, a p-type guard ring region, and an n+-type channel stopper region are formed. A plurality of floating electrodes are formed to contact the surface of the porous-oxide-film region. Another plurality of floating electrodes are formed to contact a first insulating film.

8 Claims, 18 Drawing Sheets

SEMICONDUCTOR DEVICE

BACKGROUND OF THE INVENTION

1. Field of the Invention

The present invention relates to a semiconductor device, and particularly to a power semiconductor device.

2. Description of the Background Art

A vertical-type semiconductor device is a type of power semiconductor device. In the vertical-type semiconductor device, electric current is conducted (ON state) or interrupted (OFF state) between a front surface side and a rear surface side of the semiconductor device. On the front surface side of the semiconductor substrate, for example, a region is formed in which a switching element such as IGBT (Insulated Gate Bipolar Transistor) and the like are arranged. In this region, main current flows when the semiconductor device is electrically conductive, and this region is called active region.

In the case where the semiconductor device is a power device for which a high breakdown voltage is required, the front surface side of a semiconductor substrate includes the active region formed as a central region and a termination structure portion formed to surround the active region. The termination structure portion is structured to include a breakdown voltage layer for maintaining a breakdown voltage characteristic of the semiconductor device. As such a termination structure portion, a guard ring structure including a guard ring region or a RESURF (REduced SURface Field) structure including a RESURF layer, for example, is applied.

In the semiconductor device, for the purpose of protecting the active region and the termination structure portion from the external environment, an electrically-insulating protective film is formed to generally cover these active region and termination structure portion. As the protective film, an insulating film such as silicon oxide or silicon nitride for example is used. A resin-based material may also be used. Further, a protective film made up of a plurality of materials in the shape of layers may also be formed depending on the case.

In a process such as packaging of the semiconductor device, charge may be externally introduced onto the protective film in some cases. The introduced charge may cause local field crowding, leading to non-uniform field distribution. Due to this, the resultant breakdown voltage is lower than an expected breakdown voltage, and a problem arises that a breakdown voltage characteristic cannot be ensured. In order to solve this problem, PTL 1 (Japanese Patent Laying-Open No. 2008-103530) proposes a semiconductor device in which such an influence of the charge is reduced.

SUMMARY OF THE INVENTION

The conventional semiconductor device, however, has the following problem. Specifically, because the semiconductor device has, in the termination structure portion, an insulator region formed between a guard ring region and a channel stopper region, the region of the termination structure portion is disadvantageously expanded.

The present invention has been made to solve the above problem, and an object of the invention is to provide a semiconductor device sufficiently ensuring a breakdown voltage without expanding the termination structure portion.

A semiconductor device of the present invention includes a semiconductor substrate of a first conductivity type, an element-formed region, an electric-field reduction region, and an insulating protective film. The semiconductor substrate of the first conductivity type has a first main surface and a second main surface opposite to each other. The element-formed region is formed in a predetermined region in the first main surface of the semiconductor substrate and has a predetermined semiconductor element arranged to conduct current between the first main surface and the second main surface. The electric-field reduction region is formed in the first main surface of the semiconductor substrate and located laterally with respect to the element-formed region so that the electric-field reduction region contacts the element-formed region. The insulating protective film is formed to cover the first main surface and has a predetermined dielectric constant. The electric-field reduction region includes an insulating region, a channel stopper region of the first conductivity type, a plurality of floating electrodes, and a second-conductivity-type region. The insulating region is formed from the first main surface to a predetermined depth and has a lower dielectric constant than a predetermined dielectric constant. The channel stopper region of the first conductivity type is formed opposite to the element-formed region with respect to the insulating region and spaced from the insulating region. The plurality of floating electrodes are arranged so that the electrodes have coupling capacitor components along a direction connecting the element-formed region and the channel stopper region. The second-conductivity-type region is formed to extend deeper from the insulating region.

Regarding the semiconductor device of the present invention, a breakdown voltage can sufficiently be ensured without expansion of the electric-field reduction region provided as the termination structure portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
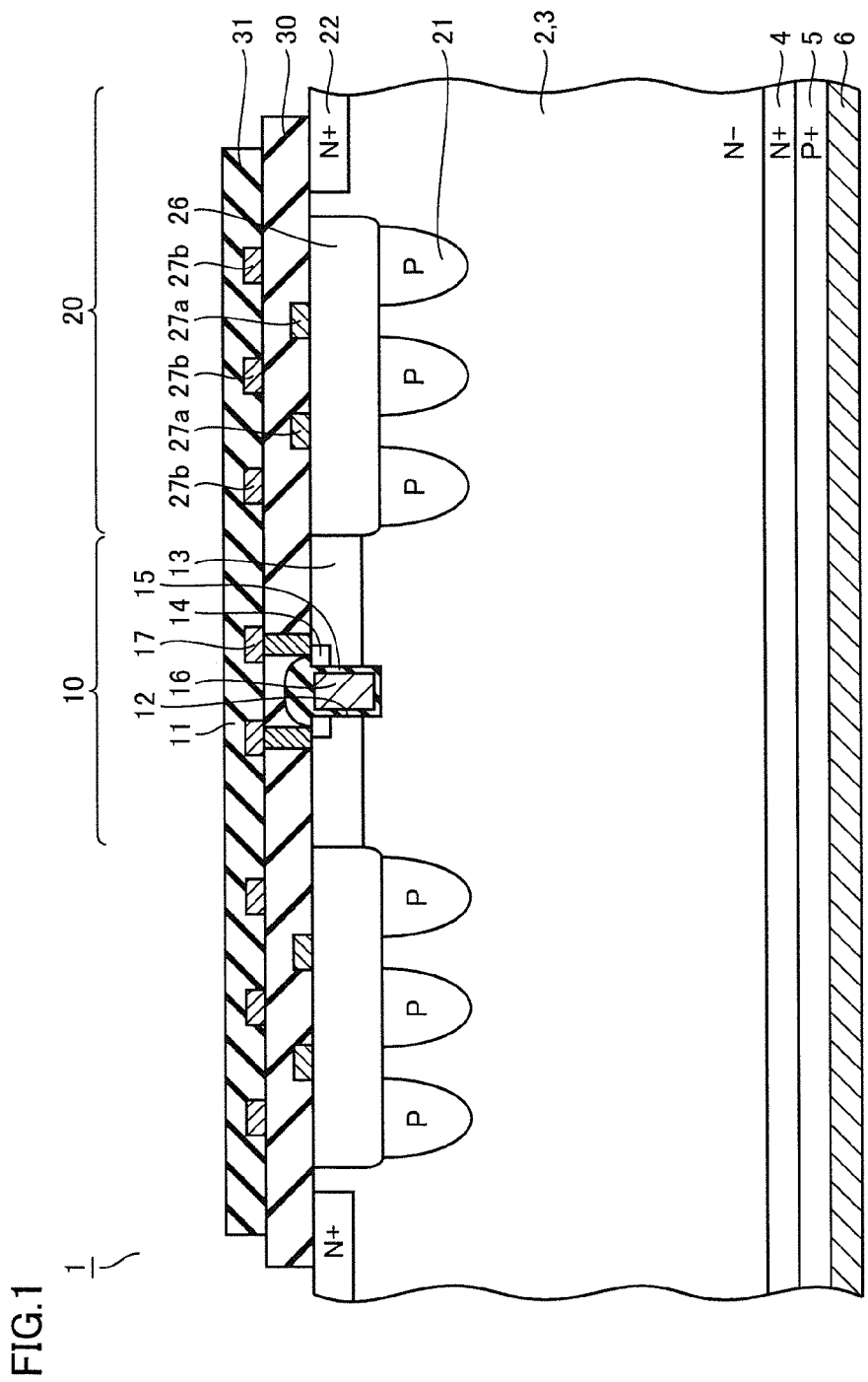
FIG. 1 is a cross section of a semiconductor device in a first embodiment of the present invention.

A semiconductor device in a first embodiment of the present invention will be described. As shown in FIG. 1, semiconductor device 1 includes an n− layer 3 formed from one surface of a semiconductor substrate 2 to a predetermined depth. In a predetermined region of n− layer 3, an active region 10 in which main current flows is formed. Active region 10 serves as an element-formed region. In active region 10, an IGBT 11 is formed as an example of switching elements.

In active region 10, a p base layer 13 is formed. A trench 12 is formed from the surface of p base layer 13 to extend through p base layer 13 and reach n− layer 3. In trench 12, a gate buried electrode 16 is formed so that a gate oxide film 15 on the side wall of trench 12 is interposed between the trench and the electrode. From the surface of p base layer 13 to a predetermined depth, an n+ emitter layer 14 is also formed. FIG. 1 shows, for the sake of simplification of the drawing, one IGBT 11 formed in active region 10.

With respect to active region 10, a termination structure portion 20 serving as an electric-field reduction region is laterally formed to surround active region 10 in the surface of semiconductor substrate 2. Termination structure portion 20 is a region for maintaining a breakdown voltage against a voltage applied to active region 10. In termination structure portion 20, a porous-oxide-film region 26, a p-type guard ring region 21, and an n+-type channel stopper region 22 are formed.

Porous-oxide-film region 26 serving as an electrically insulating region is formed to contact active region 10. Porous-oxide-film region 26 is formed by anodizing silicon so as to make the silicon porous and thereafter oxidizing the silicon with a gas. A cross section of porous-oxide-film region 26 is in the shape of a layer. Porous-oxide-film region 26 has a dielectric constant of a value smaller than that of the dielectric constant of a first insulating film 30 and a second insulating film 31 which will be described later herein.

Porous-oxide-film region 26, which is provided as a thick-oxide-film region, is formed in the region extending deeper than the bottom of trench 12. Meanwhile, porous-oxide-film region 26 is preferably formed so as not to extend above the surface of semiconductor substrate 2. A volume difference R between the volume of single crystal silicon before the porous-oxide-film region is formed and the volume of porous silicon after the porous-oxide-film region is formed (the volume before oxidation and the volume after oxidation) is represented by a known formula:

$$R = 2.2 \times (\text{density of porous silicon})/(\text{density of single crystal silicon}).$$

Since single crystal silicon has a density of about 2.3 g/cm$^3$, R is equal to 1 if the density of porous silicon is on the order of 1.0 g/cm$^3$, which enables the volume before oxidation and the volume after oxidation to remain the same.

Guard ring region 21 serving as a breakdown voltage layer is formed to extend deeper from the bottom of porous-oxide-film region 26. Channel stopper region 22 is formed opposite to active region 10 with respect to porous-oxide-film region 26 and spaced from porous-oxide-film region 26.

A plurality of floating electrodes 27a are formed to contact the surface of porous-oxide-film region 26. Floating electrodes 27a are spaced from each other along the direction connecting active region 10 and channel stopper region 22. First insulating film 30 is formed on one surface of semiconductor substrate 2 to cover these floating electrodes 27a. In an upper portion of active region 10, an emitter electrode 17 which is electrically connected to n+ emitter layer 14 is formed to contact first insulating film 30. Above porous-oxide-film region 26, a plurality of floating electrodes 27b are formed to contact first insulating film 30.

As described later herein, a coupling capacitor C is formed between floating electrode 27a located relatively lower and floating electrode 27b located relatively higher. Floating electrodes 27a and floating electrodes 27b are arranged so that they have coupling capacitor C components along the direction connecting active region 10 and channel stopper region 22. In this case, slight overlapping of floating electrodes 27a and floating electrodes 27b as seen in plan view is accepted. Basically, however, floating electrodes 27a and floating electrodes 27b are arranged alternately with each other so that they do not overlap each other. Second insulating film 31 serving as a protective film is formed to cover floating electrodes 27b and emitter electrode 17.

Meanwhile, a p+ collector layer 5 is formed from the other surface of semiconductor substrate 2 to a predetermined depth. Further, an n+ buffer layer 4 is formed to contact p+ collector layer 5. A collector electrode 6 is formed to contact this p+ collector layer. Semiconductor device 1 of the first embodiment is formed in the above-described manner.

In the following, operations of above-described semiconductor device 1 will be described. First, an ON operation will be described. A predetermined voltage which is equal to or higher than a threshold voltage is applied to gate buried electrode 16 to thereby form a channel (n type) in a portion of p base layer 13 that is located in the vicinity of gate buried layer 16, and cause the MOS (Metal Oxide Semiconductor) channel to be rendered ON. The MOS channel is thus rendered ON to thereby cause electrons to be injected from n+ emitter layer 14 through the channel into n− layer 3.

Figure 2:
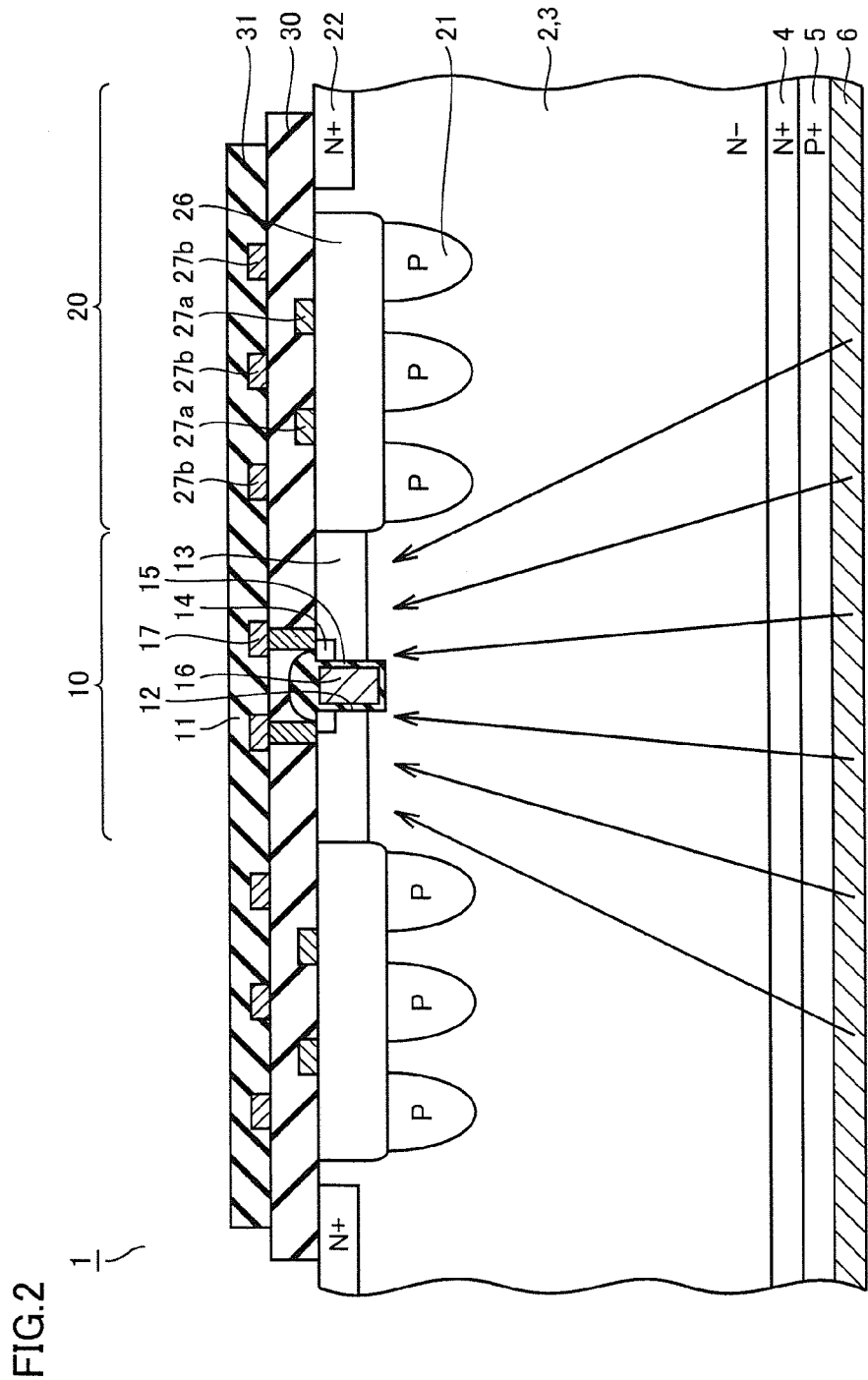
FIG. 2 is a first cross section for illustrating an operation of the semiconductor device in the first embodiment.

Meanwhile, holes are injected from p+ collector layer 5 into n− layer 3. In n− layer 3 in which electrons and holes have been injected, a conductivity modulation occurs, which reduces the voltage between collector electrode 6 and emitter electrode 17 and causes an ON state. In the ON state, as shown in FIG. 2, current flows from collector electrode 6 toward emitter electrode 17 (see the arrows).

Next, a turn-OFF operation will be described. A voltage lower than the threshold voltage is applied to gate buried electrode 16 to thereby stop injection of electrons and holes into n− layer 3. After this, holes accumulated in n− layer 3 are removed from p base layer 13 to emitter electrode 17. Meanwhile, electrons are removed to collector electrode 6. At the time when a depletion portion which has been depleted of electrons and holes becomes able to maintain a breakdown voltage, an OFF state is reached.

Figure 3:
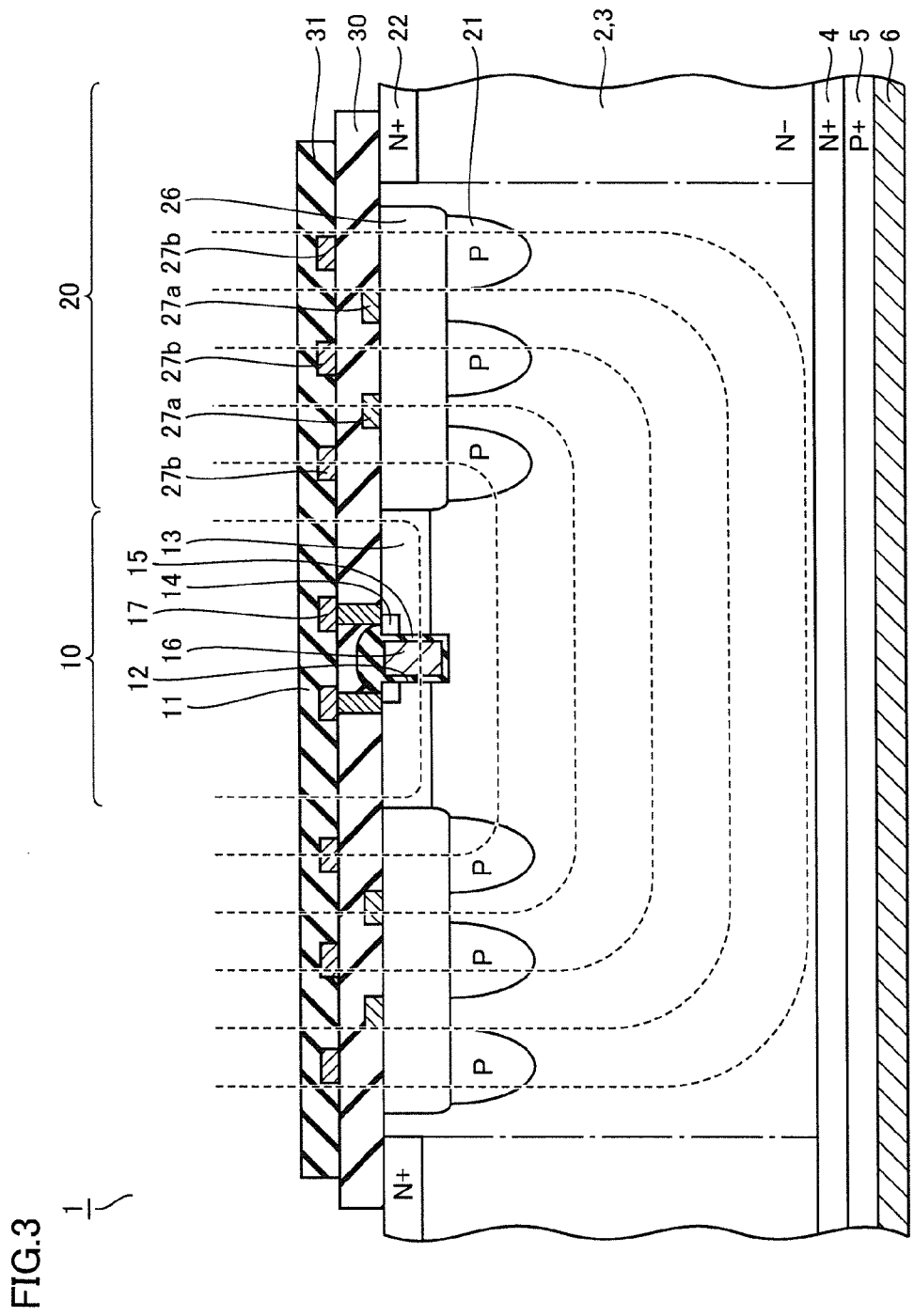
FIG. 3 is a second cross section for illustrating an operation of the semiconductor device in the first embodiment.

In the OFF state, there is a potential difference on the order of several hundreds of volts for example between emitter electrode 17 and collector electrode 6. An image (general image) of electric potential contours at this time is indicated by dotted lines in FIG. 3. Further, the edge of the depletion layer in the OFF state is indicated by a dashed-dotted line. In the above-described semiconductor device, a breakdown voltage can be maintained without distortion of the electric potential contours even if charge is externally attached (disturbance charge) to the surface of second insulating film 31 serving as a protective film. This will be described in connection with a semiconductor device in a comparative example.

Figure 4:
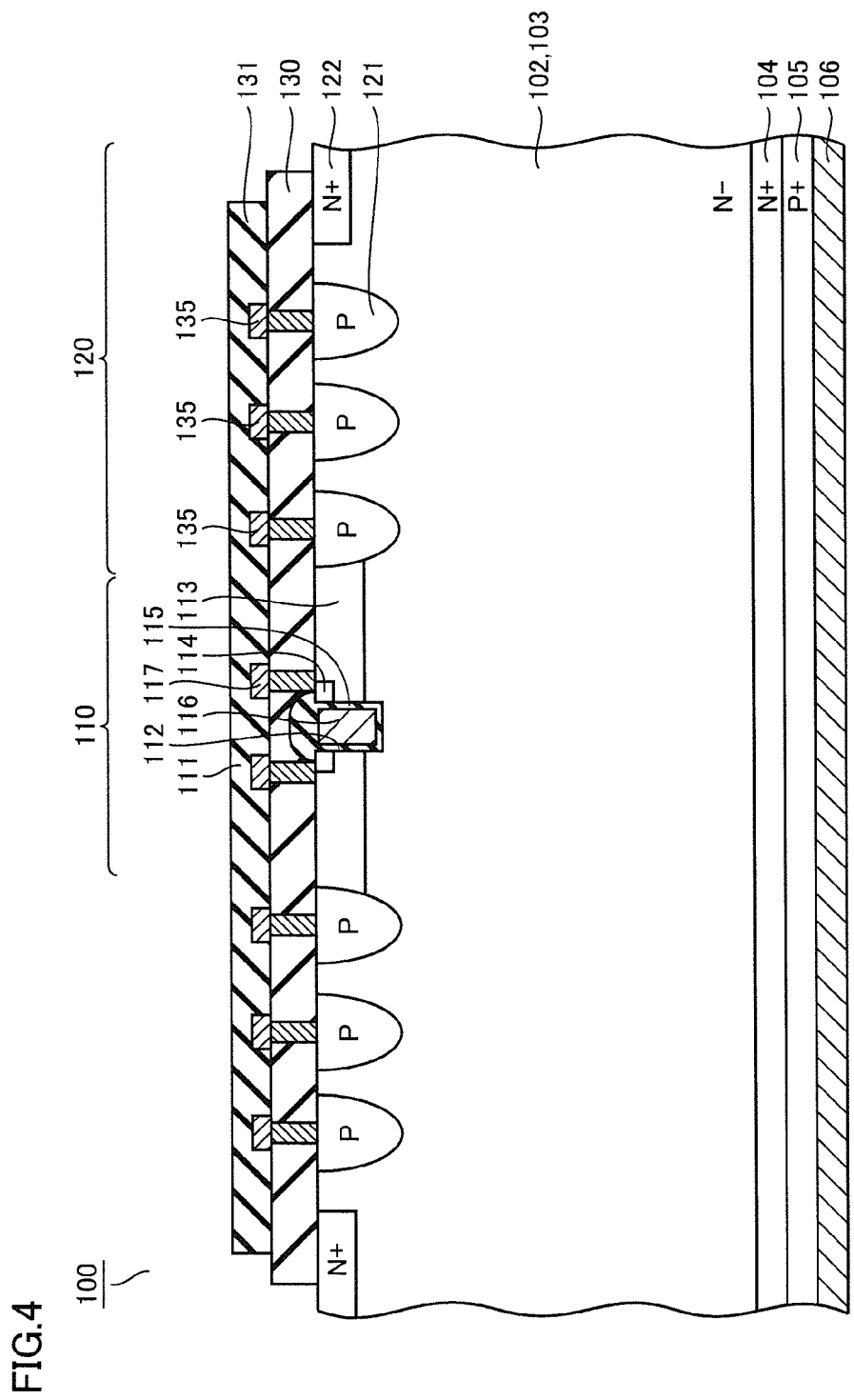
FIG. 4 is a cross section of a semiconductor device in a comparative example.

In semiconductor device 100 of the comparative example (see FIG. 4), the porous-oxide-film region and a plurality of floating electrodes are not formed, and the termination structure portion includes only a guard ring region and a channel stopper region formed in the termination structure portion. As shown in FIG. 4, in an active region 110 in one surface of a semiconductor substrate 102, an n− layer 103, a p base layer 113, an n+ emitter layer 114, a trench 112, a gate buried electrode 116, and a gate oxide film 115 are formed. In termination structure portion 120, a guard ring region 121 and a channel stopper region 122 are formed.

A first insulating film 130 is formed to cover a region including p base layer 113 and guard ring region 121. An emitter electrode 117 and a guard ring electrode 135 are formed to contact the surface of the first insulating film. A second insulating film 131 serving as a protective film is formed to cover emitter electrode 117 and guard ring electrode 135. In the other surface of semiconductor substrate 102, an n+ buffer layer 104, a p+ collector layer 105, and a collector electrode 106 are formed.

In the following, operations will be described. First, regarding an ON operation, a predetermined voltage which is equal to or higher than a threshold voltage is applied to gate buried electrode 116 to thereby render the MOS channel ON. The MOS channel is thus rendered ON to thereby cause electrons and holes to be injected into n− layer 103 and accordingly cause a conductivity modulation, which reduces the voltage between collector electrode 106 and emitter electrode 117 and causes an ON state.

Next, regarding a turn-OFF operation, a voltage lower than the threshold voltage is applied to gate buried electrode 116 to thereby render the MOS channel OFF. As the MOS channel is rendered OFF, injection of electrons and holes into n− layer 103 is stopped. After this, holes accumulated in n− layer 103 are removed to emitter electrode 117 and electrons are removed to collector electrode 106. At the time when a depletion portion which has been depleted of electrons and holes becomes able to maintain a breakdown voltage, an OFF state is reached.

In order to protect the semiconductor device from the external environment, a protective film (second insulating film 131) is formed on the surface of the semiconductor device. As the protective film, an insulating film such as silicon oxide or silicon nitride for example is used. A resin-based material may also be used. Further, a plurality of materials in the shape of layers may also be formed to protect the semiconductor device, depending on the case. Into or to this protective film of the semiconductor device, charge may be introduced (attached) due to external contamination or the like. In a process such as packaging of the semiconductor device as well, charge may be attached to the surface of the protective film.

Figure 5:
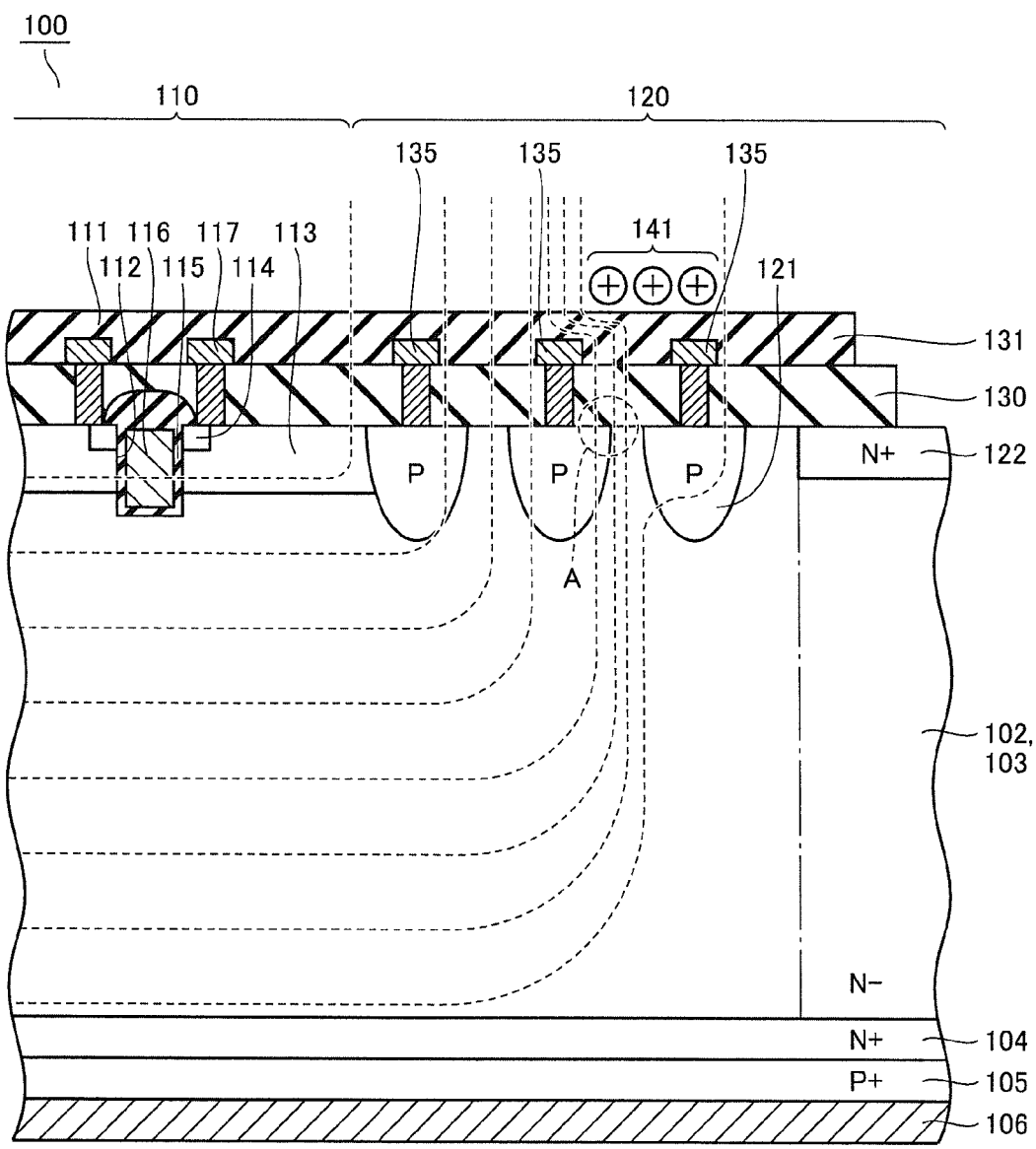
FIG. 5 is a partial cross section for illustrating a problem of the semiconductor device in the comparative example.

When charge attaches to the protective film, the electric potential contours when the semiconductor device is the OFF state are influenced. As shown in FIG. 5, when charge 141 attaches to second insulating film 131 serving as a protective film, the electric potential contours (see the dotted lines) are relatively closer to each other in a certain portion as indicated by a dotted-line frame A, which may result in field crowding. The field crowding may cause an expected breakdown voltage to vary, resulting in a decrease of the breakdown voltage. As the breakdown voltage decreases, a breakdown voltage characteristic cannot be maintained.

Figure 6:
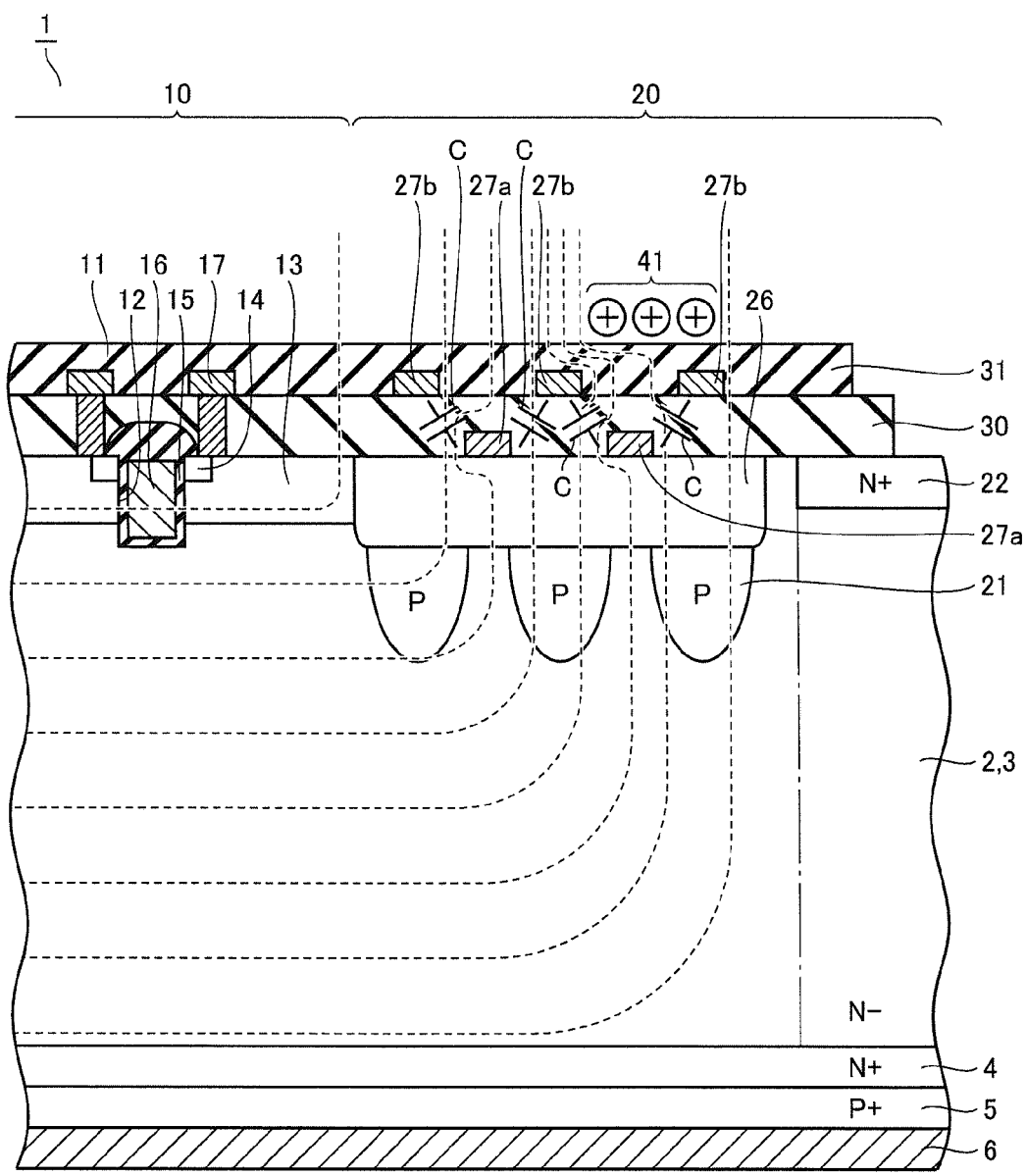
FIG. 6 is a partial cross section for illustrating the function and effect of the semiconductor device in the first embodiment.

In contrast to the comparative example, semiconductor device 1 in the first embodiment includes porous-oxide-film region 26 and floating electrodes 27a, 27b formed in the semiconductor device to thereby enable the electric potential contours to be prevented from distorting. As shown in FIG. 6, when charge 41 attaches to second insulating film 31 serving as a protective film, the electric potential contours (see the dotted line) are relatively closer to each other in a certain portion and relatively farther from each other in another portion in the vicinity of second insulating film 31. This is similar to the semiconductor device in the comparative example.

In semiconductor device 1 of the first embodiment as shown in FIG. 6, floating electrodes 27a and floating electrodes 27b are arranged so that they have coupling capacitor C components along the direction connecting active region 10 and channel stopper region 22. Accordingly, the electric potential between active region 10 and channel stopper region 22 is divided (potential-divided) so that the closeness between the electric potential contours (see the dotted lines) is lessened.

The value of the dielectric constant of porous-oxide-film region 26 is set lower than that of the dielectric constant of first insulating film 30 and second insulating film 31. Porous-oxide-film region 26, which is provided as a thick-oxide-film region, is formed deeper than trench 12 of the IGBT. Therefore, even if there is a certain portion where the electric potential contours are relatively closer to each other (distorted) in the vicinity of the portion where charge 41 is attached, the electric potential contours are appropriately spaced from each other in porous-oxide-film region 26 and the electric potential contours (see the dotted lines) are arranged at regular intervals to a certain extent. Accordingly, the distortion of the electric potential contours (see the dotted lines) is not present in guard ring region 21 maintaining a breakdown voltage, which enables the semiconductor device to maintain a breakdown voltage characteristic.

Moreover, floating electrodes 27a, 27b and porous-oxide-film region 26 are arranged in a region where guard ring region 21 is formed. Thus, a breakdown voltage characteristic can be maintained without expanding termination structure portion 20.

First Modification

Figure 7:
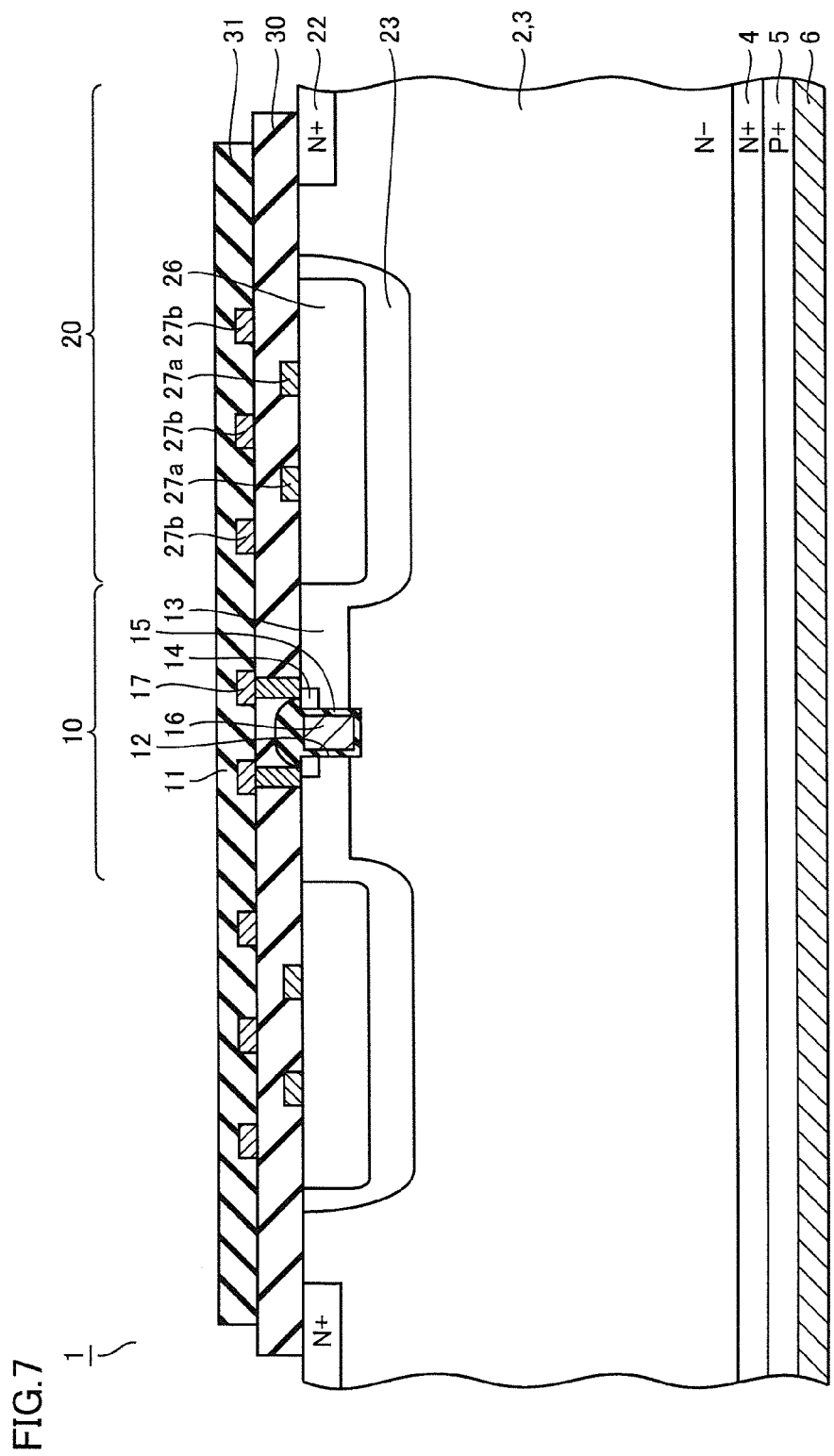
FIG. 7 is a cross section of a semiconductor device in a first modification of the first embodiment.

A description will be given of a first modification of the semiconductor device in the first embodiment, specifically of a semiconductor device of a RESURF structure that includes a RESURF layer serving as a breakdown voltage layer in the termination structure portion. As shown in FIG. 7, semiconductor device 1 includes a p-type RESURF layer 23 formed to surround the lateral and lower sides of porous-oxide-film region 26. RESURF layer 23 is formed to contact p base layer 13 of active region 10. Features other than the above-described ones are similar to those of semiconductor device 1 shown in FIG. 1. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 8:
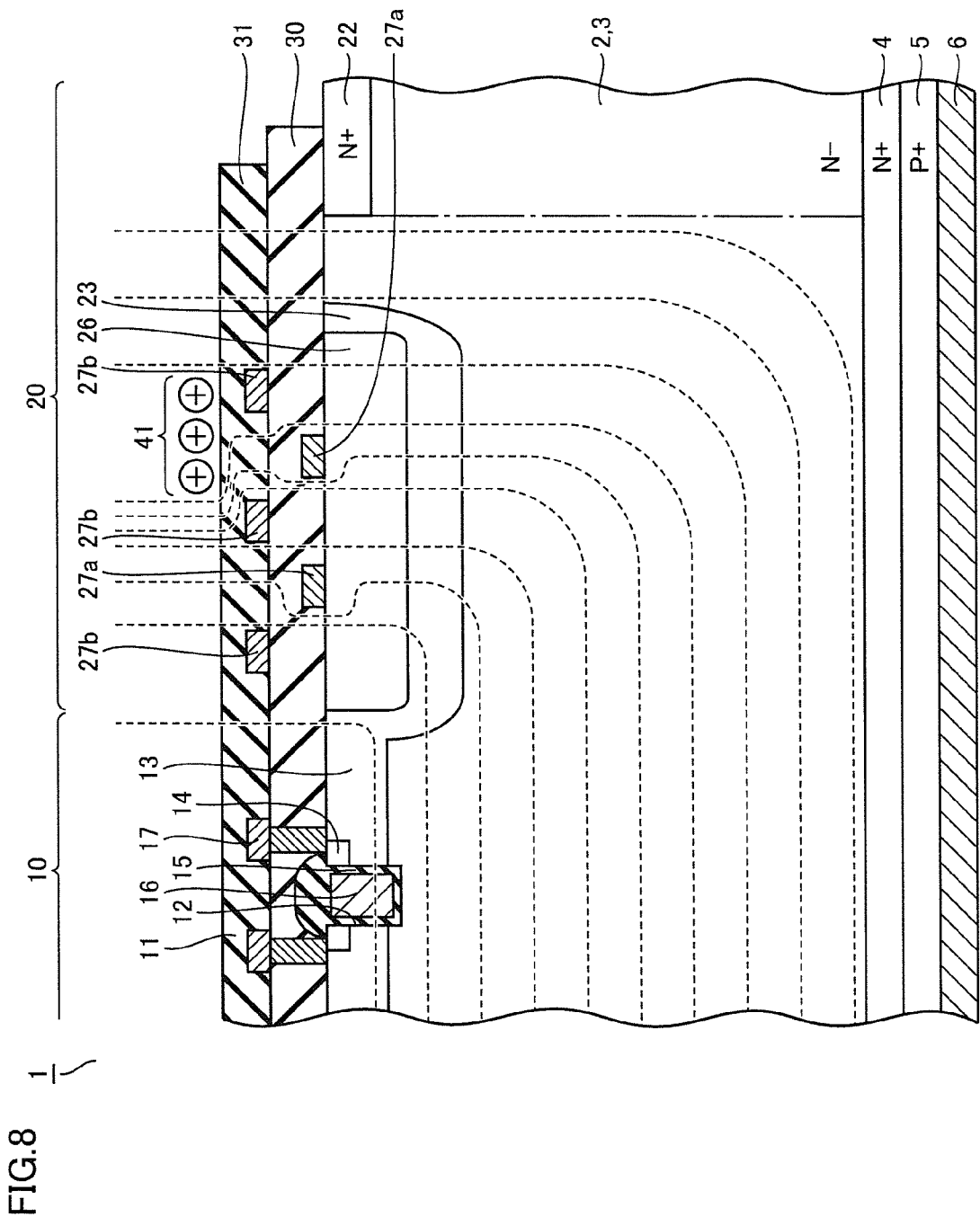
FIG. 8 is a partial cross section for illustrating the function and effect of the semiconductor device in the first modification of the first embodiment.

In semiconductor device 1 of the first modification, termination structure portion 20 includes floating electrodes 27a, 27b and porous-oxide-film region 26 formed in the termination structure portion. Accordingly, as shown in FIG. 8, even if charge (disturbance charge) 41 attaches to second insulating film 31 serving as a protective film and the electric potential contours in the vicinity of second insulating film 31 are relatively farther from each other in a certain portion and relatively closer to each other (distorted) in another portion in the OFF state, the distortion of electric potential contours does not appear in RESURF layer 23 and a breakdown voltage characteristic of the semiconductor device can be maintained.

In other words, as described above, the electric potential between active region 10 and channel stopper region 22 is divided (potential-divided) by coupling capacitor C provided by floating electrode 27a and floating electrode 27b, so that the closeness between the electric potential contours (see the dotted lines) is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in RESURF layer 23 maintaining a breakdown voltage, which enables the semiconductor device to maintain a breakdown voltage characteristic.

Second Modification

A second modification of the semiconductor device in the first embodiment, specifically a semiconductor device having a trench structure in the termination structure portion will be described.

Figure 9:
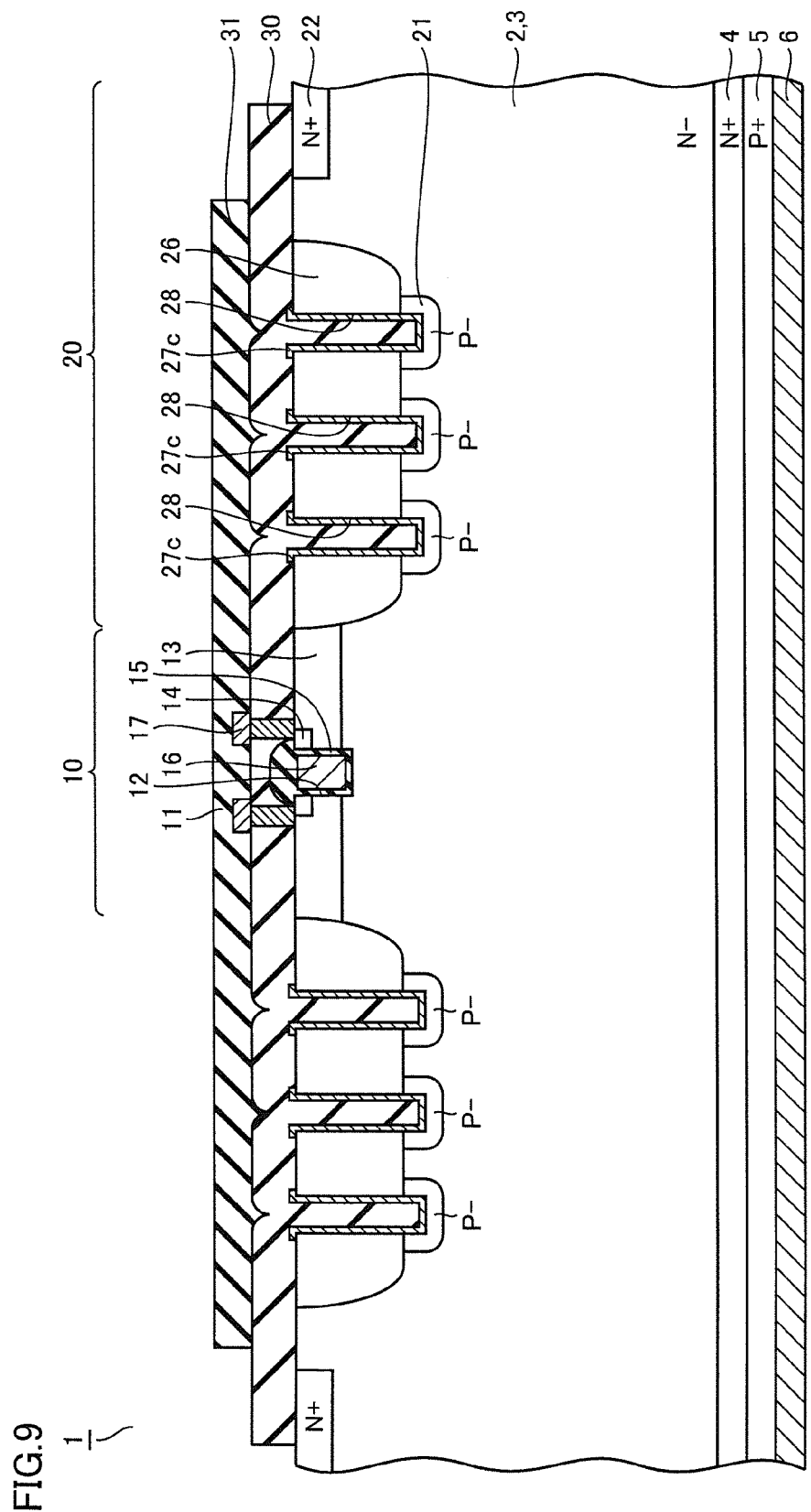
FIG. 9 is a cross section of a semiconductor device in a second modification of the first embodiment.

As shown in FIG. 9, semiconductor device 1 includes a plurality of trenches 28 formed through a porous-oxide-film region 26. These trenches 28 are spaced from each other along the direction connecting active region 10 and channel stopper region 22. A guard ring region 21 serving as a breakdown voltage layer is formed to surround the lateral and lower sides of a portion of trench 28 that extends downward from porous-oxide-film region 26.

A floating electrode 27c is formed to continue along the whole inner wall of trench 28. A first insulating film 30 is formed to fill trenches 28. Features other than the above-described ones are similar to those of the semiconductor device shown in FIG. 1. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 10:
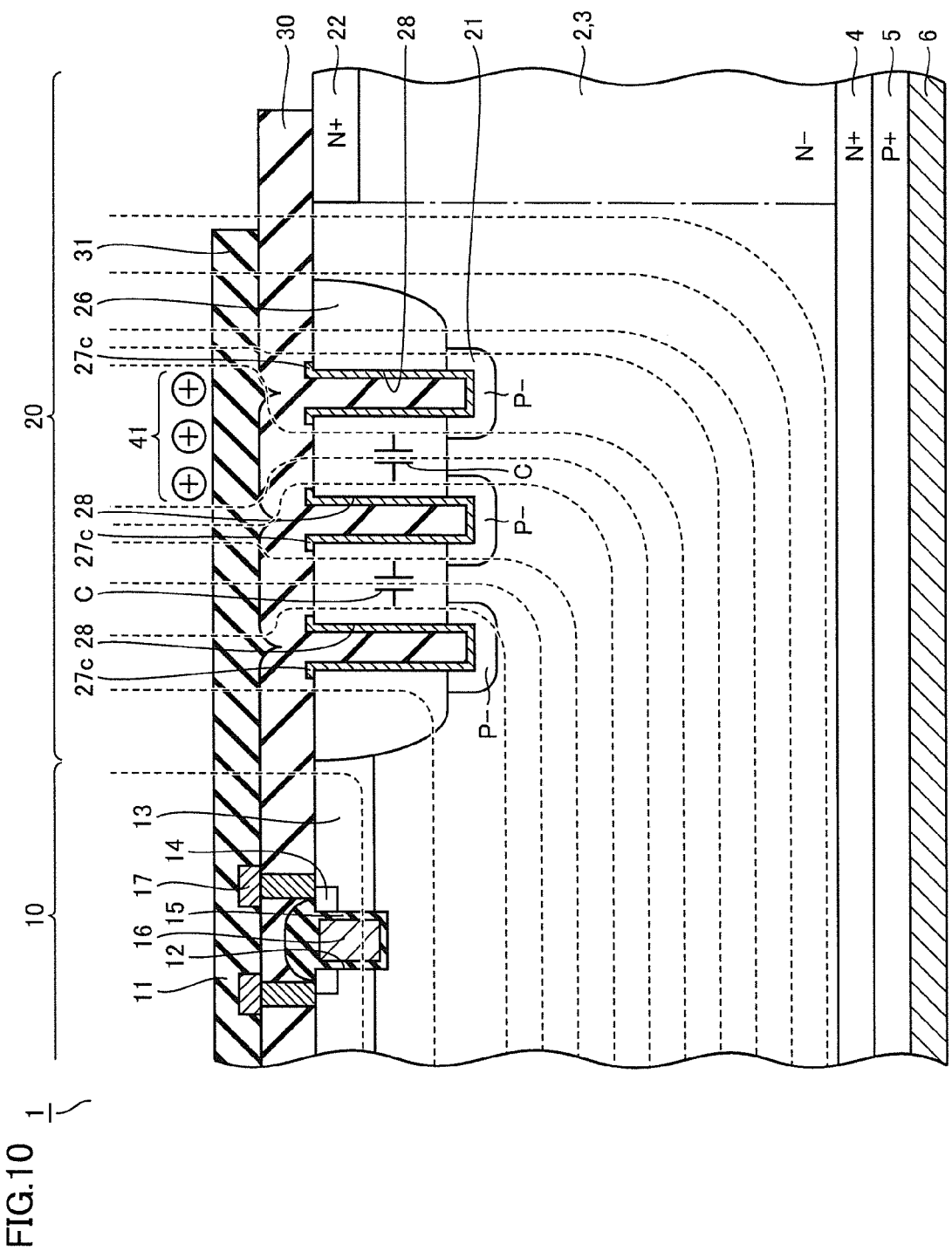
FIG. 10 is a partial cross section for illustrating the function and effect of the semiconductor device in the second modification of the first embodiment.

In semiconductor device 1 of the second modification, termination structure portion 20 includes floating electrodes 27c and porous-oxide-film region 26 formed in the termination structure portion. Accordingly, as shown in FIG. 10, even if charge (disturbance charge) 41 attaches to second insulating film 31 serving as a protective film and the electric potential contours in the vicinity of second insulating film 31 are relatively farther from each other in a certain portion and relatively closer to each other (distorted) in another portion in the OFF state, the distortion of the electric potential does not appear in guard ring region 21 and a breakdown voltage characteristic of the semiconductor device can be maintained.

In other words, like above-described floating electrodes 27a, 27b, a plurality of floating electrodes 27c provide coupling capacitor C to divide (potential-divide) the electric potential between active region 10 and channel stopper region 22, so that the closeness between the electric potential contours is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in guard ring region 21 maintaining a breakdown voltage, which enables the semiconductor device to maintain a breakdown voltage characteristic Third Modification A third modification of the semiconductor device in the first embodiment, specifically another semiconductor device having a trench structure in the termination structure portion will be described.

Figure 11:
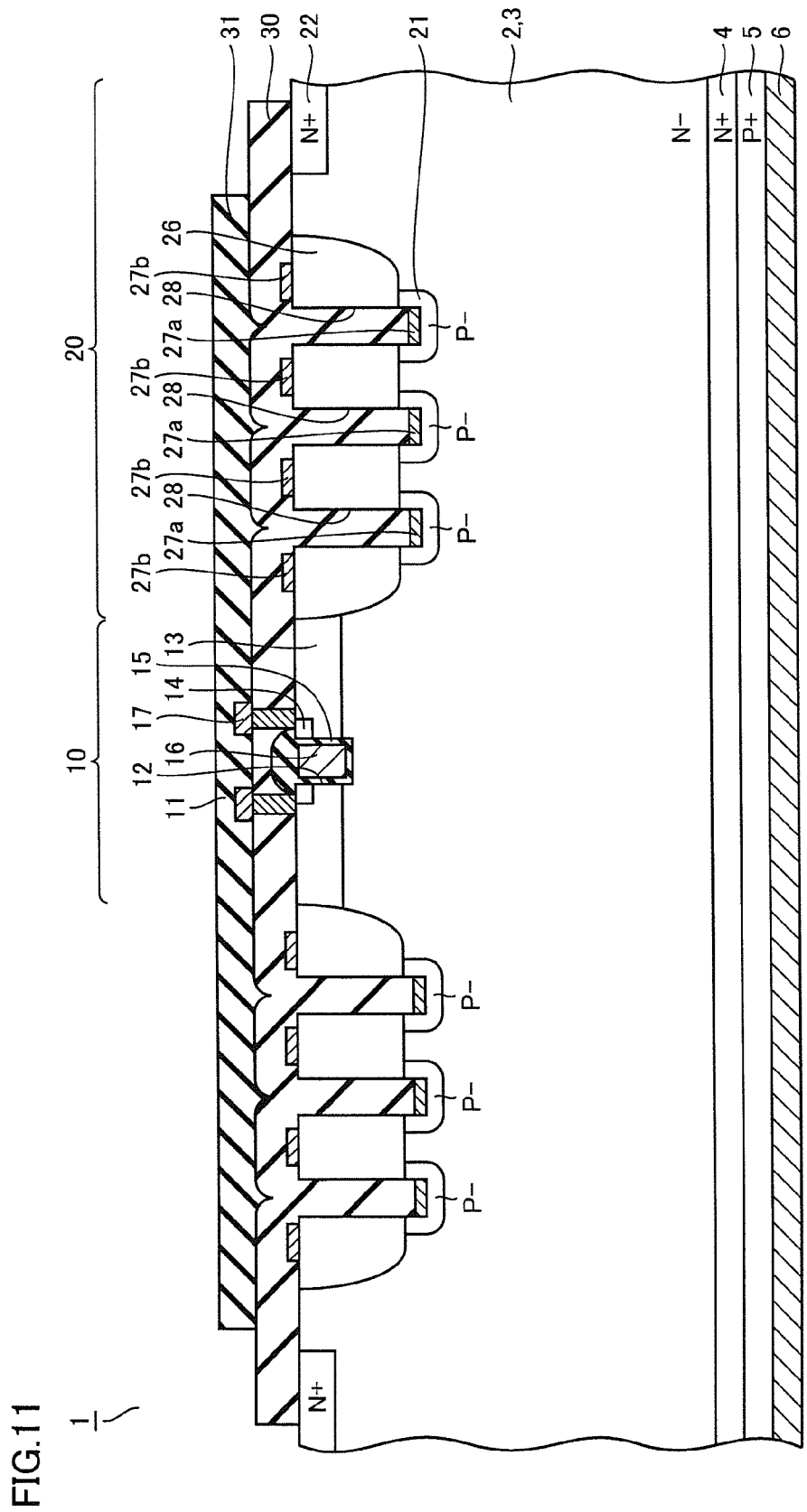
FIG. 11 is a cross section of a semiconductor device in a third modification of the first embodiment.

As shown in FIG. 11, semiconductor device 1 includes a plurality of trenches 28 formed through a porous-oxide-film region 26. These trenches 28 are spaced from each other along the direction connecting active region 10 and channel stopper region 22. A guard ring region 21 serving as a breakdown voltage layer is formed to surround the lateral and lower sides of a portion of trench 28 that extends downward from porous-oxide-film region 26.

A floating electrode 27a is formed in a bottom portion of trench 28. A floating electrode 27b is also formed on the surface of porous-oxide-film region 26 that is located in the vicinity of the opening end of trench 28. A first insulating film 30 is formed to fill trenches 28. Features other than the above-described ones are similar to those of the semiconductor device shown in FIG. 1. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 12:
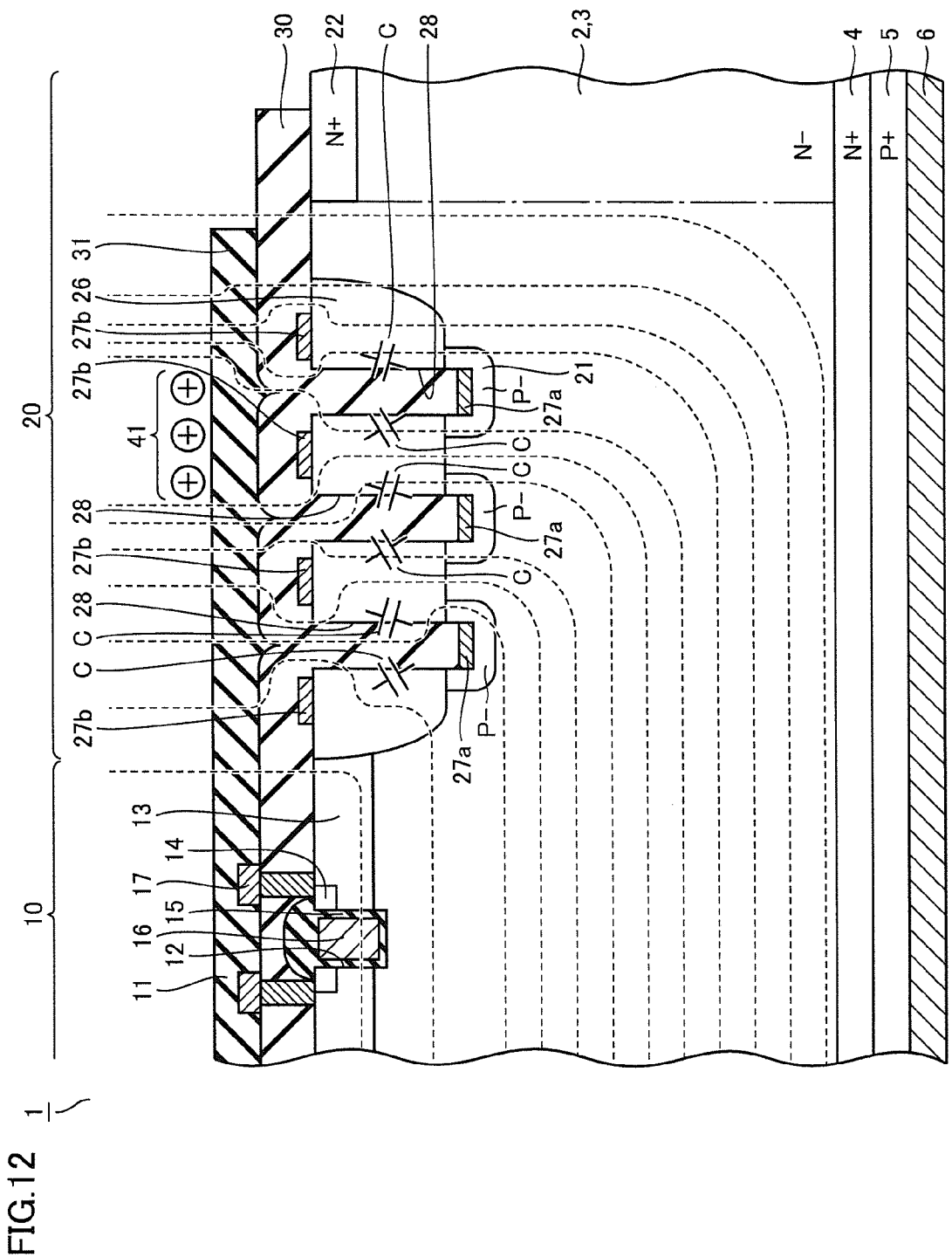
FIG. 12 is a partial cross section for illustrating the function and effect of the semiconductor device in the third modification of the first embodiment.

In semiconductor device 1 of the third modification, termination structure portion 20 includes floating electrodes 27a, 27b and porous-oxide-film region 26 formed in the termination structure portion. Accordingly, as shown in FIG. 12, even if charge 41 attaches to second insulating film 31 serving as a protective film and the electric potential contours in the vicinity of second insulating film 31 are relatively farther from each other in a certain portion and relatively closer to each other (distorted) in another portion in the OFF state, the distortion of the electric potential does not appear in guard ring region 21 and a breakdown voltage characteristic of the semiconductor device can be maintained.

In other words, as described above, the electric potential between active region 10 and channel stopper region 22 is divided (potential-divided) by coupling capacitor C provided by floating electrode 27a and floating electrode 27b, so that the closeness between the electric potential contours is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in guard ring region 21 maintaining a breakdown voltage, which enables the semiconductor device to maintain a breakdown voltage characteristic.

Second Embodiment

Figure 13:
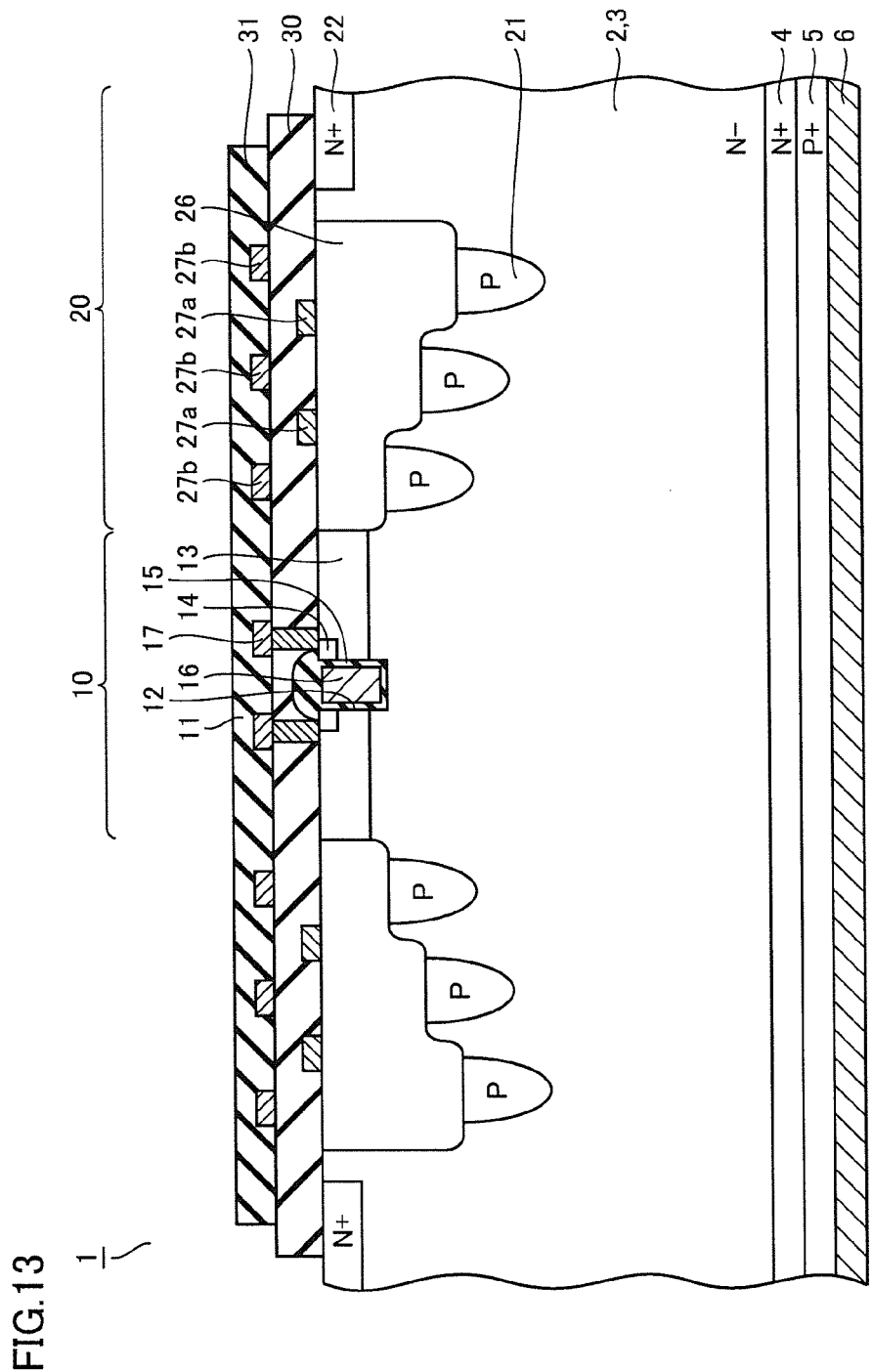
FIG. 13 is a cross section of a semiconductor device in a second embodiment of the present invention.

A semiconductor device in a second embodiment of the present invention will be described. As shown in FIG. 13, semiconductor device 1 includes a porous-oxide-film region 26 formed in a stepwise manner to extend gradually deeper from a side of p base layer 13 toward a side of channel stopper region 22. Features other than the above-described ones are similar to those of the semiconductor device shown in FIG. 1. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 14:
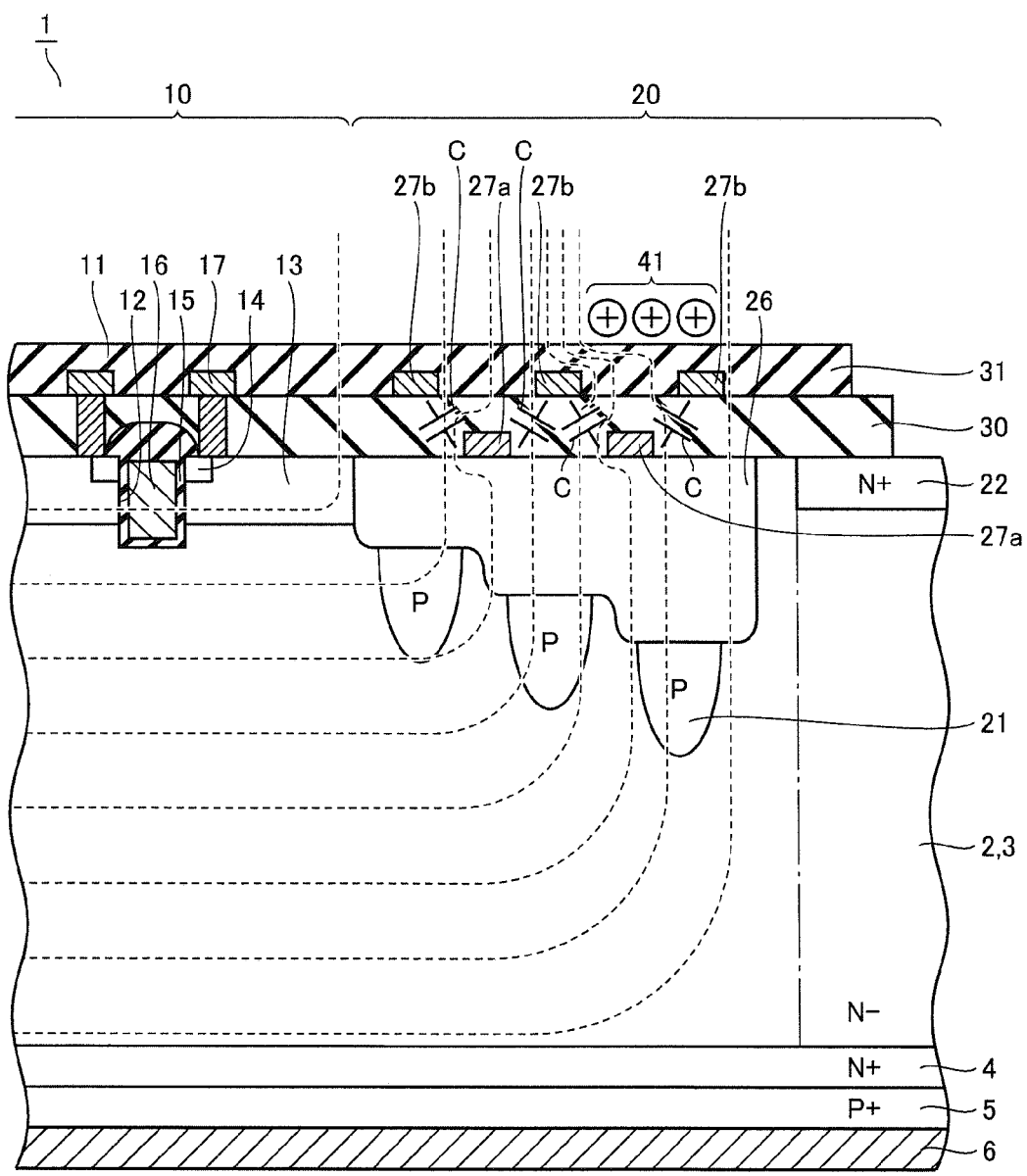
FIG. 14 is a partial cross section for illustrating the function and effect of the semiconductor device in the second embodiment.

In semiconductor device 1 of the second embodiment, termination structure portion 20 includes floating electrodes 27a, 27b and porous-oxide-film region 26 formed in the termination structure portion. Accordingly, as shown in FIG. 14, even if charge 41 attaches to second insulating film 31 serving as a protective film and the electric potential contours in the vicinity of second insulating film 31 are relatively farther from each other in a certain portion and relatively closer to each other (distorted) in another portion in the OFF state, the distortion of the electric potential does not appear in guard ring region 21 and a breakdown voltage characteristic of the semiconductor device can be maintained.

In other words, as described above in connection with the first embodiment, the electric potential between active region 10 and channel stopper region 22 is divided (potential-divided) by coupling capacitor C provided by floating electrode 27a and floating electrode 27b, so that the closeness between the electric potential contours is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in guard ring region 21 maintaining a breakdown voltage, which enables the semiconductor device to maintain a breakdown voltage characteristic.

Furthermore, in above-described semiconductor device 1, porous-oxide-film region 26 is formed in a stepwise manner to extend gradually deeper from a side of p base layer 13 toward a side of channel stopper region 22. Namely, porous-oxide-film region 26 is formed to become thicker in a stepwise manner toward a side of channel stopper region 22. Accordingly, respective inflection points of the electric potential contours directly below guard ring regions 21 can be located gradually deeper. Thus, in the end of the semiconductor device (chip's end), the electric potential contours can be prevented from being located close to each other, and a more stable breakdown voltage characteristic can be obtained.

According to the above description of semiconductor device 1, porous-oxide-film region 26 is formed to extend gradually deeper in a stepwise manner, from a side of p base layer 13 toward a side of channel stopper region 22. However, it is enough for porous-oxide-film region 26 to be formed so that its portion located on the side of channel stopper region 22 is formed to extend deeper than its portion located on the side of p base layer 13.

First Modification

Figure 15:
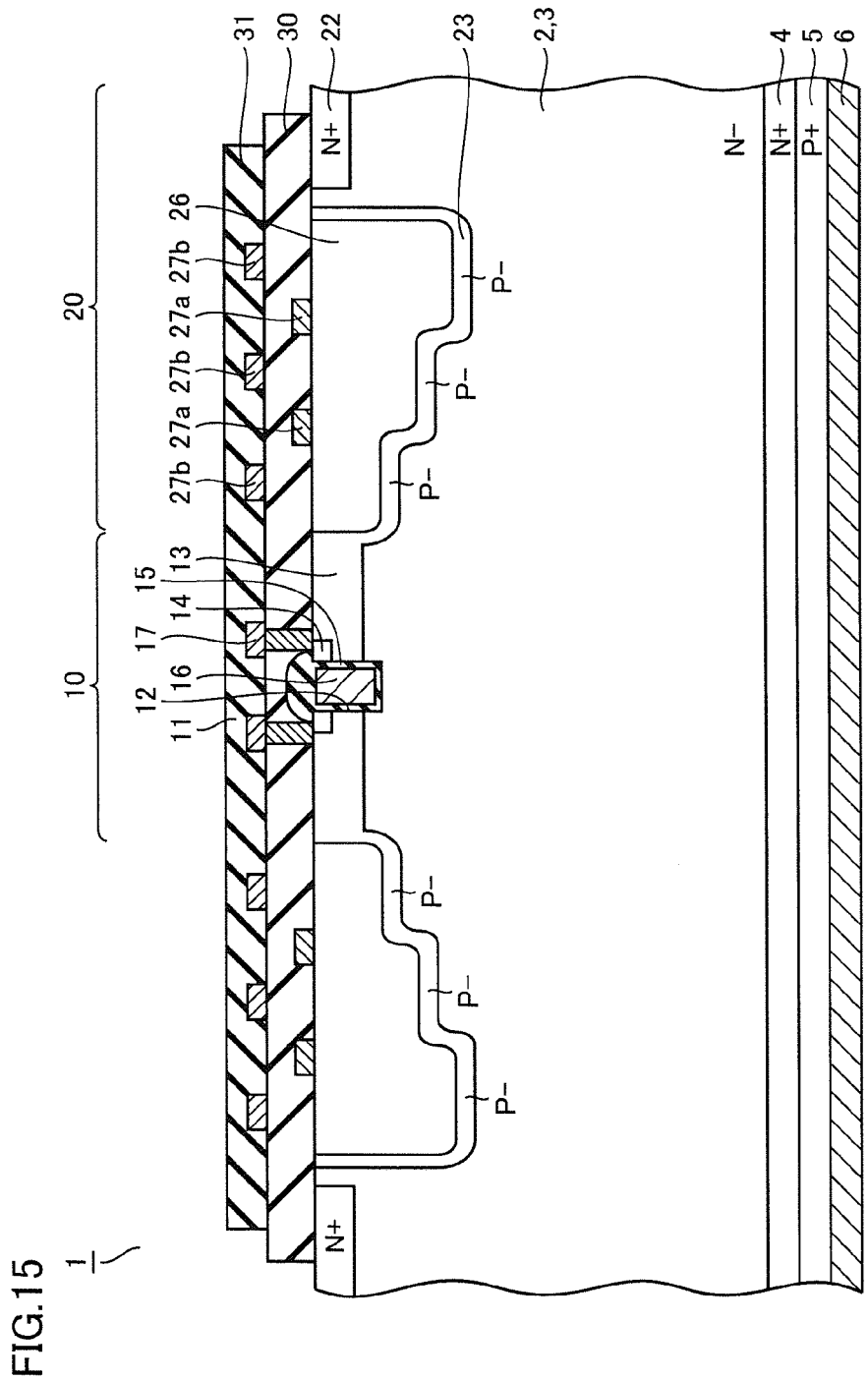
FIG. 15 is a cross section of a semiconductor device in a first modification of the second embodiment.

A description will be given of a first modification of the semiconductor device in the second embodiment, specifically of a semiconductor device of a RESURF structure that includes a RESURF layer serving as a breakdown voltage layer in the termination structure portion. As shown in FIG. 15, semiconductor device 1 includes a p-type RESURF layer 23 serving as a breakdown voltage layer and formed to surround the lateral and lower sides of porous-oxide-film region 26 which is formed to become thicker in a stepwise manner. RESURF layer 23 is formed to contact p base layer 13 of active region 10. Features other than the above-described ones are similar to those of the semiconductor device shown in FIG. 13. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 16:
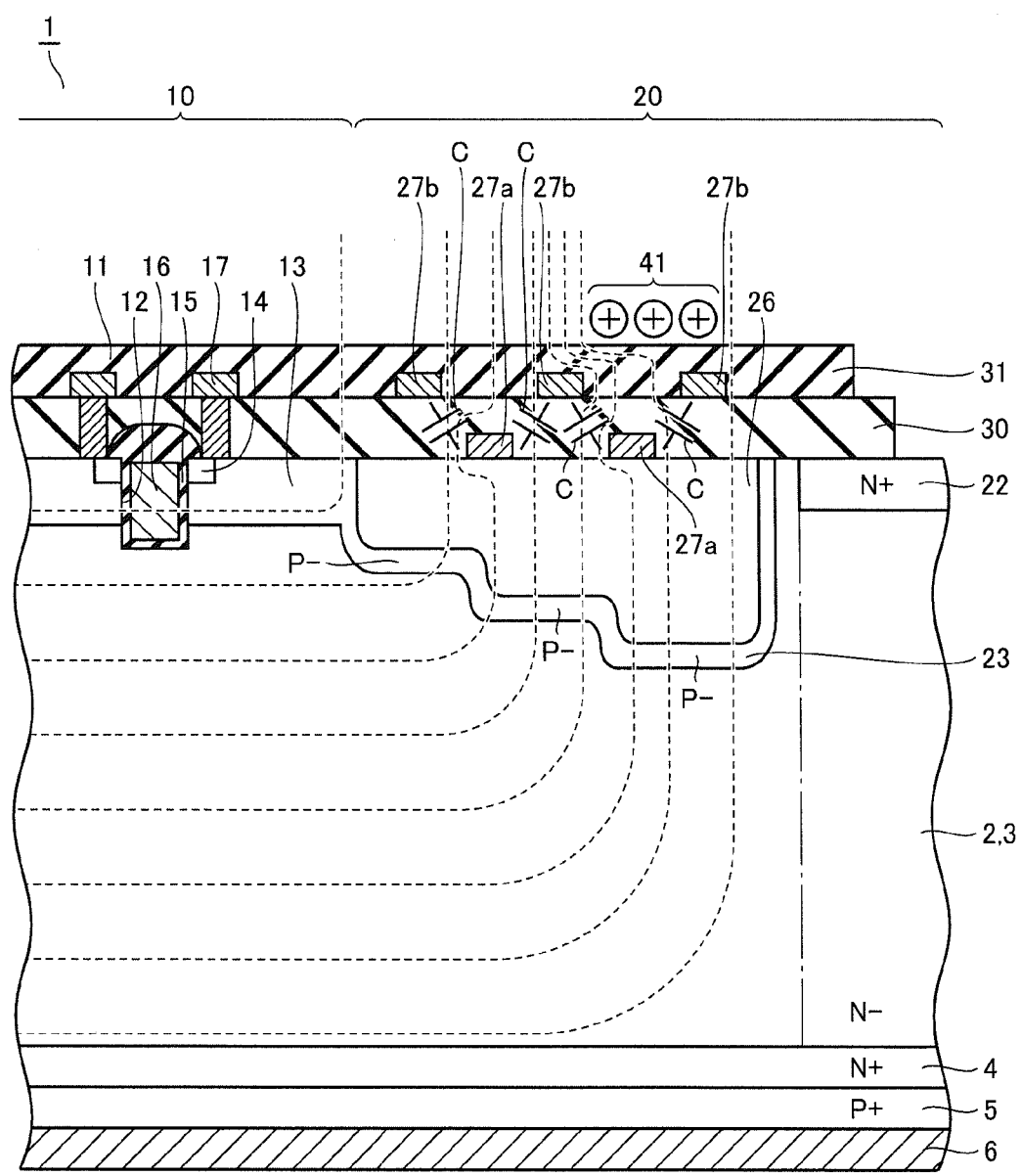
FIG. 16 is a partial cross section for illustrating the function and effect of the semiconductor device in the first modification of the second embodiment.

In semiconductor device 1 of the first modification, termination structure portion 20 includes floating electrodes 27a, 27b and porous-oxide-film region 26 formed in the termination structure portion. Accordingly, as shown in FIG. 16, even if charge 41 attaches to second insulating film 31 serving as a protective film and the electric potential contours in the vicinity of second insulating film 31 are relatively farther from each other in a certain portion and relatively closer to each other (distorted) in another portion in the OFF state, the electric potential distortion does not appear in RESURF layer 23 and a breakdown voltage characteristic of the semiconductor device can be maintained.

In other words, as described above in connection with the first embodiment, the electric potential between active region 10 and channel stopper region 22 is divided (potential-divided) by coupling capacitor C provided by floating electrode 27a and floating electrode 27b, so that the closeness between the electric potential contours is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in RESURF layer 23 maintaining a breakdown voltage, which enables the semiconductor device to maintain a breakdown voltage characteristic.

Furthermore, since porous-oxide-film region 26 is formed to become thicker in a stepwise manner toward a side of channel stopper region 22, respective inflection points of the electric potential contours directly below RESURF layer 23 can be located gradually deeper. Thus, in the end of the semiconductor device (chip's end), the electric potential contours can be prevented from being located close to each other, and a more stable breakdown voltage characteristic can be obtained.

Second Modification

Figure 17:
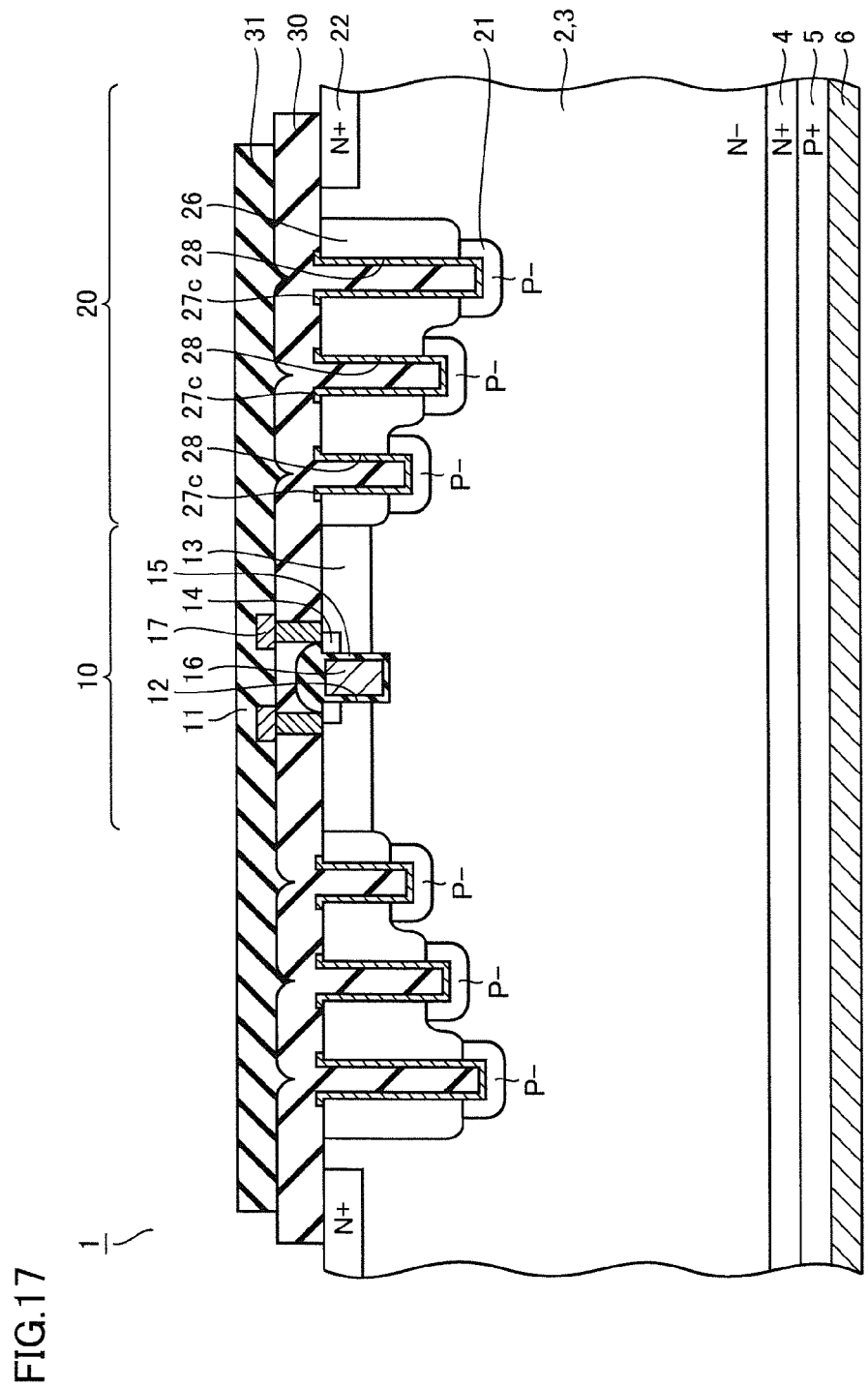
FIG. 17 is a cross section of a semiconductor device in a second modification of the second embodiment.

A second modification of the semiconductor device in the second embodiment, specifically a semiconductor device having a trench structure in the termination structure portion will be described. As shown in FIG. 17, semiconductor device 1 includes a plurality of trenches 28 formed through a porous-oxide-film region 26 which is formed to become thicker in a stepwise manner. These trenches 28 are spaced from each other along the direction connecting active region 10 and channel stopper region 22. A guard ring region 21 serving as a breakdown voltage layer is formed to surround the lateral and lower sides of a portion of trench 28 that extends downward from porous-oxide-film region 26.

A floating electrode 27c is formed to continue along the whole inner wall of trench 28. A first insulating film 30 is formed to fill trenches 28. Features other than the above-described ones are similar to those of the semiconductor device shown in FIG. 13. Therefore, the same components are denoted by the same reference characters, and the description thereof will not be repeated.

In the following, operations will briefly be described. Regarding an ON operation, a predetermined voltage equal to or higher than a threshold voltage is applied to gate buried electrode 16 to thereby cause the MOS channel to be rendered ON, cause electrons and holes to be injected into n− layer 3, and accordingly cause a conductivity modulation, which reduces the voltage between collector electrode 6 and emitter electrode 17 and causes an ON state.

Next, regarding a turn-OFF operation, a voltage lower than the threshold voltage is applied to gate buried electrode 16 to thereby render the MOS channel OFF. Then, holes accumulated in n− layer 3 are removed to emitter electrode 17 and electrons are removed to collector electrode 6, which causes an OFF state.

Figure 18:
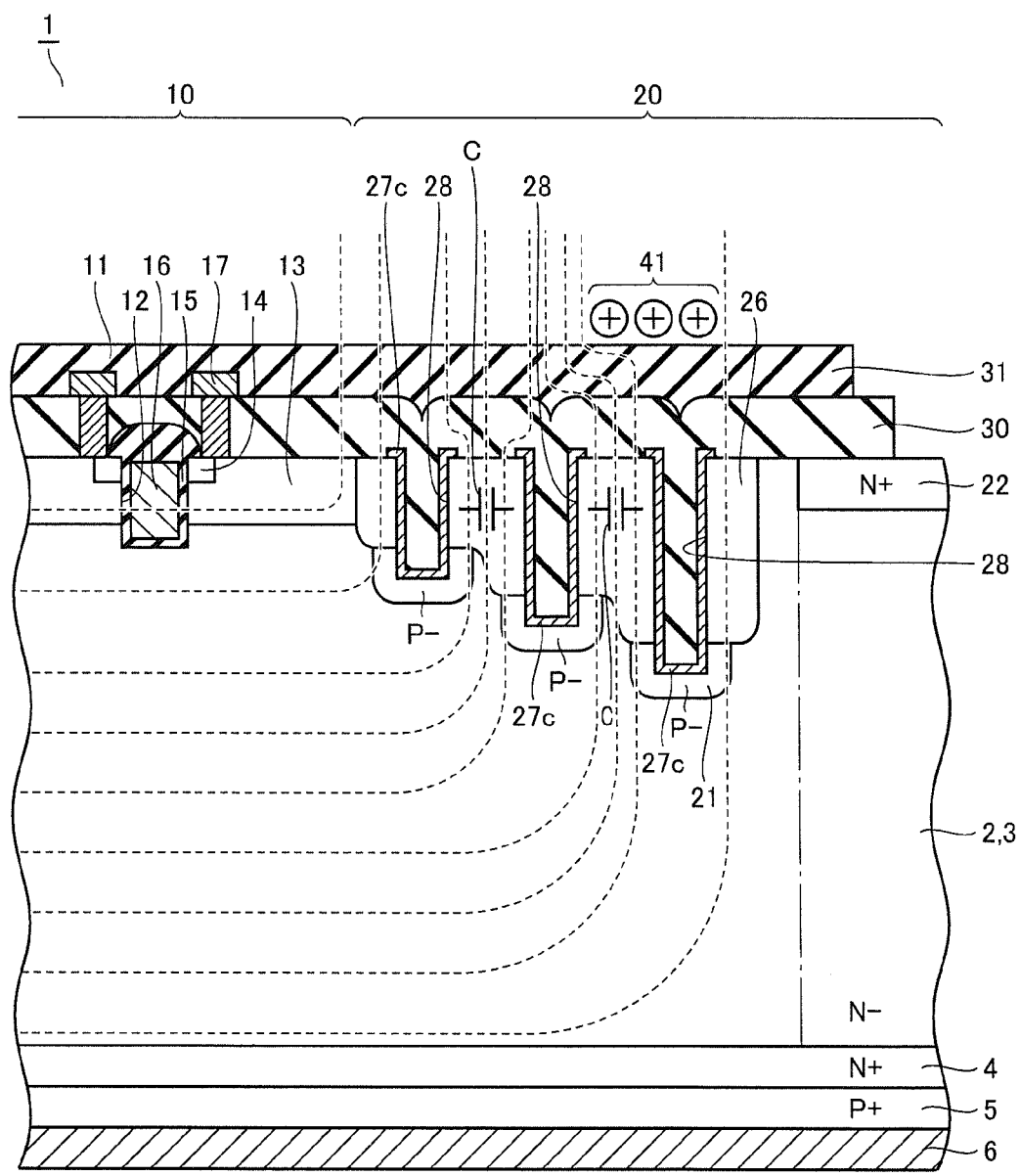
FIG. 18 is a partial cross section for illustrating the function end effect of the semiconductor device in the second modification of the second embodiment.

In semiconductor device 1 of the second modification, termination structure portion 20 includes floating electrodes 27c and porous-oxide-film region 26 formed in the termination structure portion. Accordingly, as shown in FIG. 18, even if charge 41 attaches to second insulating film 31 serving as a protective film and the electric potential contours in the vicinity of second insulating film 31 are relatively farther from each other in a certain portion and relatively closer to each other (distorted) in another portion in the OFF state, the distortion of the electric potential does not appear in guard ring region 21 and a breakdown voltage characteristic of the semiconductor device can be maintained.

In other words, like above-described floating electrodes 27a, 27b, a plurality of floating electrodes 27c provide coupling capacitor C to divide (potential-divide) the electric potential between active region 10 and channel stopper region 22, so that the closeness between the electric potential contours is lessened.

Moreover, in porous-oxide-film region 26 having a relatively lower dielectric constant than second insulating film 31 for example, the electric potential contours are appropriately spaced from each other and the electric potential contours are arranged at regular intervals to a certain extent. Accordingly, the distortion of the electric potential contours is not present in guard ring region 21 maintaining a breakdown voltage, which enables the semiconductor device to maintain a breakdown voltage characteristic.

Furthermore, since porous-oxide-film region 26 is formed to become thicker in a stepwise manner toward a side of channel stopper region 22, respective inflection points of the electric potential contours directly below guard ring region 21 can be located gradually deeper. Thus, in the end of the semiconductor device (chip's end), the electric potential contours can be prevented from being located close to each other, and a more stable breakdown voltage characteristic can be obtained.

Regarding each of the above-described embodiments, the IGBT has been described as an example of the semiconductor element formed in the active region provided as an element-formed region. Other examples of the semiconductor element may include planar-type diode, planar-type MOS transistor, trench-gate-type MOS transistor, planar-type IGBT, planar-type/trench-type Cool-MOS®, planar-type/trench-type gate-controlled thyristor latch device, for example.

As an example of the insulating region, the porous-oxide-film region has been described. The insulating region is not limited to the porous-oxide-film region, as long as the insulating region meets the conditions that the insulating region is a thick film, the insulating film has a lower dielectric constant than the protective film, and the dielectric constant is stable.

The present invention is effectively used for a high-breakdown-voltage power device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a semiconductor substrate of a first conductivity type having a first main surface and a second main surface opposite to each other;
an element-formed region formed in a predetermined region in said first main surface of said semiconductor substrate and having a predetermined semiconductor element disposed to conduct current between said first main surface and said second main surface;
an electric-field reduction region formed in said first main surface of said semiconductor substrate and located laterally with respect to said element-formed region so that said electric-field reduction region contacts said element-formed region; and
an insulating protective film formed to cover said first main surface and having a predetermined dielectric constant,
said electric-field reduction region including:
an insulating region formed from said first main surface to a predetermined depth and having a lower dielectric constant than said dielectric constant of said protective film;
a channel stopper region of the first conductivity type formed opposite to said element-formed region with respect to said insulating region and spaced from said insulating region;
a plurality of floating electrodes arranged so that said electrodes have coupling capacitor components along a direction connecting said element-formed region and said channel stopper region; and
a second-conductivity-type region formed to extend deeper from said insulating region.

2. The semiconductor device according to claim 1, wherein said insulating region is a porous-oxide-film region.

3. The semiconductor device according to claim 1, wherein said plurality of floating electrodes include:
a first floating electrode disposed relatively lower; and
a second floating electrode disposed relatively higher, and
said first floating electrode and said second floating electrode are disposed so that capacitive coupling between said first floating electrode and said second floating electrode has coupling capacitor components along said direction.

4. The semiconductor device according to claim 1, further comprising a plurality of trenches spaced from each other along said direction and formed through said insulating region to reach said second-conductivity-type region, wherein
said plurality of floating electrodes are formed to respectively cover respective inner walls of said plurality of trenches.

5. The semiconductor device according to claim 3, further comprising a plurality of trenches spaced from each other along said direction and formed through said insulating region to reach said second-conductivity-type region, wherein
said first floating electrode is formed on a part of each of respective inner walls of said plurality of trenches, and
said second floating electrode is formed on a part of said insulating region that is located at an opening end of said trench.

6. The semiconductor device according to claim 1, wherein said insulating region is formed so that said insulating region located on a side of said channel stopper region is deeper than said insulating region located on a side of said element-formed region.

7. The semiconductor device according to claim 1, wherein said second-conductivity-type region is guard ring regions formed to be spaced from each other along said direction.

8. The semiconductor device according to claim 1, wherein said second-conductivity-type region is a RESURF region formed to surround lateral and lower sides of said insulating region.

* * * * *